US006483528B1

(12) United States Patent
Yamade et al.

(10) Patent No.: US 6,483,528 B1
(45) Date of Patent: Nov. 19, 2002

(54) THERMAL PRINT HEAD AND METHOD OF MANUFACTURING THEREOF

(75) Inventors: Takumi Yamade, Kyoto (JP); Hiroaki Hayashi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/980,415

(22) PCT Filed: Jun. 15, 2000

(86) PCT No.: PCT/JP00/03933

§ 371 (c)(1), (2), (4) Date: Nov. 30, 2001

(87) PCT Pub. No.: WO00/76775

PCT Pub. Date: Dec. 21, 2000

(30) Foreign Application Priority Data

Jun. 15, 1999 (JP) .......................................... 11-167765

(51) Int. Cl.[7] ......................... B41J 2/335; C23C 14/06; C23C 14/34

(52) U.S. Cl. ...................................................... 347/203

(58) Field of Search ................................. 347/200, 203

(56) References Cited

U.S. PATENT DOCUMENTS 5,072,236 A 12/1991 Tatsumi et al.

FOREIGN PATENT DOCUMENTS

| | | | |
|---|---|---|---|
| JP | 57-185174 | * 11/1982 | ............. B41J/3/20 |
| JP | 02-292058 | 12/1990 | |
| JP | 08-025668 | 1/1996 | |
| JP | 10-034989 | 2/1998 | |

OTHER PUBLICATIONS

International Search Report, dated Sep. 26, 2000.

* cited by examiner

*Primary Examiner*—Huan Tran
(74) *Attorney, Agent, or Firm*—Merchant & Gould P.C.

(57) ABSTRACT

A thermal printhead (1) comprises a substrate (2), an electrode pattern (3) formed on the substrate, including a common electrode and a plurality of individual electrodes, a heating resister (5)connected to the electrode pattern (3), and a protective coating (8) including a plurality of layers (81, 82, 83, 84) covering the electrode pattern (3) and the heating resister (5). The protective coating includes an outermost layer (84) composed mainly of SiC and an admixture of carbon.

10 Claims, 4 Drawing Sheets

THERMAL PRINT HEAD AND METHOD OF MANUFACTURING THEREOF

TECHNICAL FIELD

The present invention relates to a thermal printhead and a method of making the same.

BACKGROUND ART

A common thermal printhead currently in use includes a substrate formed with an electrode pattern including a common electrode and individual electrodes. The substrate is also formed with a heating resister connected to the electrode pattern. Further, the electrode pattern and the heating resister are covered and protected by a multi-layer protective coating.

In use, an outermost layer of the protective coating makes direct contact with the printing paper, and therefore worn out after repeated contacts with the paper. For example, when the printing is continued for a distance of over 100 kilometers, not only the outermost layer but also an inner layer is gradually worn by friction, eventually exposing the heating resister and the electrodes. Such a situation leads to a problem of e.g. white or black streaks found in the print.

The protective coating can be made more durable if the outermost layer is made significantly thicker. However, this causes another problem that an increased distance from the heating resister to the paper reduces thermal response, resulting in poor printing quality.

In order to avoid such a problem, a variety of non-oxide ceramics superior in a number of coating characteristics are employed as a material for the outermost layer. Among them, silicon carbide (SiC) and silicon nitride ($Si_3N_4$) are used extensively. These ceramic materials in general have a high hardness and are believed to have a superior anti-wear characteristic. For this reason, it is believed that use of these materials should allow the outermost layer to be made as accordingly thin as 4 $\mu$m for increased thermal response.

However, even if such a hard material as SiC of $Si_3N_4$ is used for the outermost layer, it is still impossible to improve all film characteristics required of the outermost layer. Recently in particular, a demonstrating test has proven that even such hard materials did not provide as improved anti-wear characteristic as expected. For example, in a wearing test conducted to SiC, a thin coating of SiC was worn by repeated rubbing with a metal ball under a predetermined condition (to be detailed later). Result was, as shown in FIG. 3, that after about 1000 times of rubbing cycle, a gradual increase was found in friction coefficient, which eventually resulted in an amount of wear as much as 1.1 m. This is due to a chemical reaction at an atom-molecular level on the coating surface, in which the surface formed as SiC changed to silicon dioxide ($SiO_2$). As for $Si_3N_4$, as will be clear from FIG. 3, its friction coefficient was found to be fairly high even at the beginning.

As described above, it is clear from the graph in FIG. 3 that the friction coefficient is a factor that determines the anti-wear characteristic and slidability, and that it is impossible to improve the anti-wear characteristic and slidability if the friction coefficient is high in general. Because of this, even if the outermost layer of the protective coating is made of such a material as SiC and $Si_3N_4$, the anti-wear characteristic and slidability cannot be improved significantly, and there is still room for research and development in the improvement of these.

On the other hand, there is another problem related to adhesion between the outermost layer and the primer layer. Specifically, if the outermost layer is formed of a common oxide ceramic, a good adhesion with the primer layer is not obtained. If the outermost layer is formed of a hard non-oxide material such as SiC and $Si_3N_4$, there is another problem that once a scratch is formed due to an external force, the coating can easily come off along the scratch because of the high hardness.

Still another problem exists in the field of electrostatic puncture. Specifically, since the oxide ceramics, SiC and $Si_3N_4$ have very low electronic conductivity, when they are slid on the printing paper, friction can cause the outermost layer to be electrically charged, which may lead to the electrostatic puncture. In order to prevent this, an electrically conducting material can be added. This has solved the problem of electrostatic puncture, but it has posed still another problem of electric corrosion that water condensation for example on the head surface causes ionization and elusion.

DISCLOSURE OF THE INVENTION

It is therefore an object of the present invention to provide a thermal printhead having a good slidability with respect particularly to the printing paper and an improved anti-wear characteristic, by changing material composition of the outermost layer.

Another object of the present invention is to provide a method of manufacturing such a thermal printhead.

According to a first aspect of the present invention, there is provided a thermal printhead comprising: a substrate; an electrode pattern formed on the substrate, including a common electrode and a plurality of individual electrodes; a plurality of heating dots connected to the electrode pattern; and a protective coating including a plurality of layers covering the electrode pattern and the heating dots. With the above, the protective coating includes an outermost layer composed mainly of SiC and an admixture of carbon.

Preferably, the carbon content in the outermost layer is not lower than 60 mol percent.

According to a preferred embodiment of the present invention, the protective coating includes, in addition to the outermost layer, a thick glass layer covering the heating dots and the electrode pattern, a thin glass layer formed on the thick glass layer, and an adhesion layer formed between the thin glass layer and the outermost layer. Further, the heating dots are provided by a straight thick-film resister.

According to the thermal printhead having the above construction and the arrangement, the outermost layer contains, in addition to SiC, carbon as the admixture. As a result, slidability (anti-wear characteristic) and adhesion to the primer layer can be improved by varying an amount of carbon inclusion.

According to a second aspect of the present invention, there is provided a method of manufacturing a thermal printhead comprising: a substrate; an electrode pattern formed on the substrate, including a common electrode and a plurality of individual electrodes; a plurality of heating dots connected to the electrode pattern; and a protective coating including a plurality of layers covering the electrode pattern and the heating dots. In this method, the outermost layer of the protective coating is formed by spattering with a use of a target composed mainly of SiC and an admixture of carbon.

Preferably, the carbon content in the target is 60–80 mol percent. By adjusting the carbon content within this range, film characteristic of the resulting outermost layer can be controlled.

According to a preferred embodiment of the present invention, the spattering is provided by a reactive spattering.

According to the above method of manufacture, the outermost layer is composed mainly of SiC but also include carbon as an admixture. In the outermost layer thus formed, a carbon mol percentage with respect to all of the composing atoms is slightly higher than in the equilibrium of pure SiC, which results in a various change in film characteristics of the outermost layer. Specifically, in the outermost layer composed of a mixture of pure SiC and extra carbon, even if the rubbing by the printing paper continues for a long distance, an extremely low friction coefficient is maintained for a long time. Further, the outermost layer including an admixture of carbon has a lower film stress than the layer provided by pure SiC, providing a denser layer. This improves adhesion to the primer layer and hardness, resulting in improvement in mechanical strength. Further, the outmost layer of the above arrangement has a low electric conductivity, which is not charged by the sliding friction with the paper. On the other hand, the lower conductivity causes very little electric corrosion.

The functions and advantages described above is most significant when the carbon content in the outermost layer is from 60–80 mol percent.

The carbon content in the outermost layer can be adjusted by means of a reactive spattering, in which capture of carbon into the outermost layer is controlled at an atomic level. Through this control, material composition when forming the outermost layer can be optimized.

Other characteristics and advantages of the present invention will become clearer from the following description to be presented with reference to the accompanying drawings.

BEST MODE FOR CARRYING OUT THE INVENTION

Hereinafter, a preferred embodiment of the present invention will be described specifically, with reference to the attached drawings.

Figure 1:
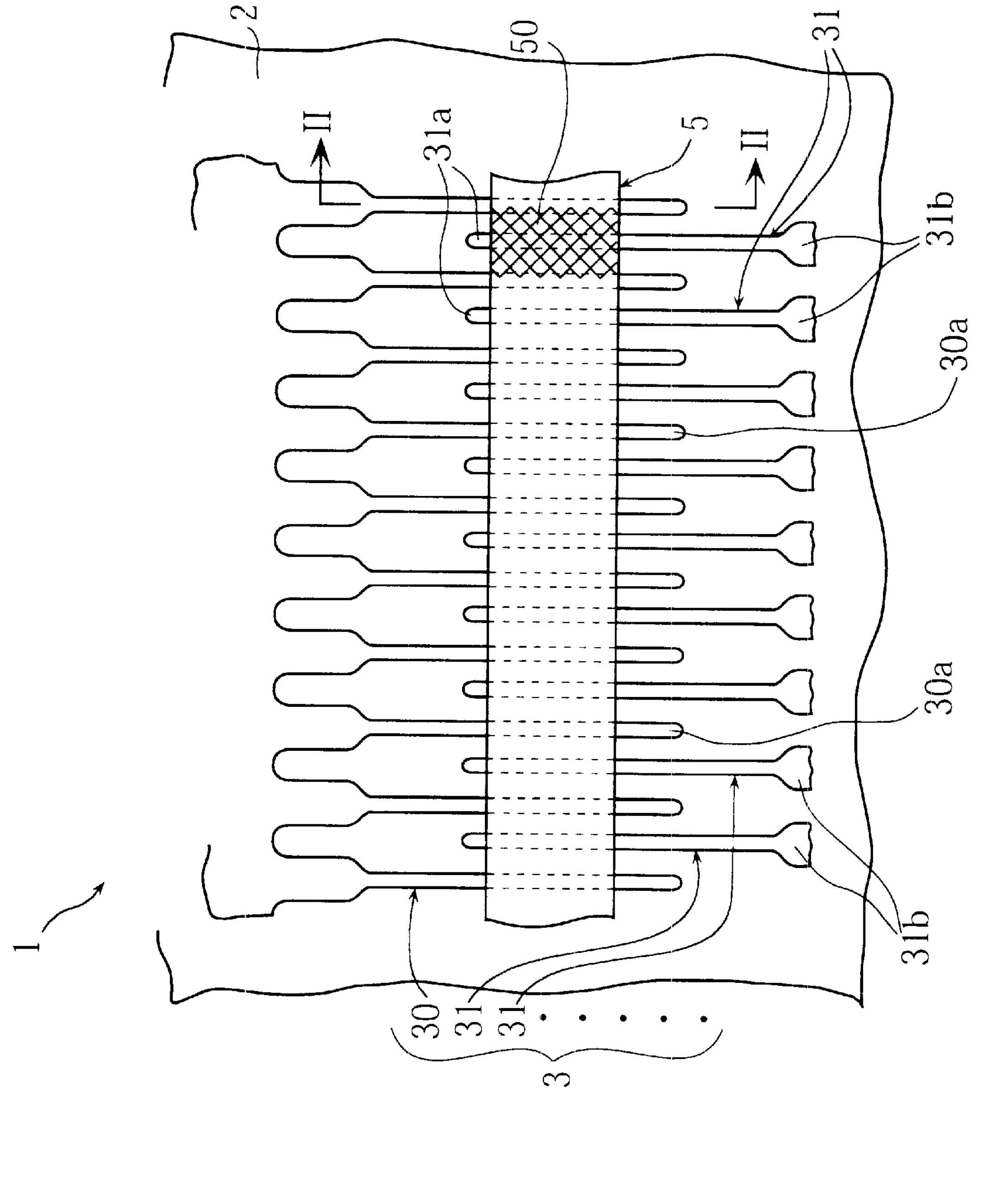
FIG. 1 is a simplified plan view showing a principal portion of a thermal printhead according to an embodiment of the present invention.
Figure 2:
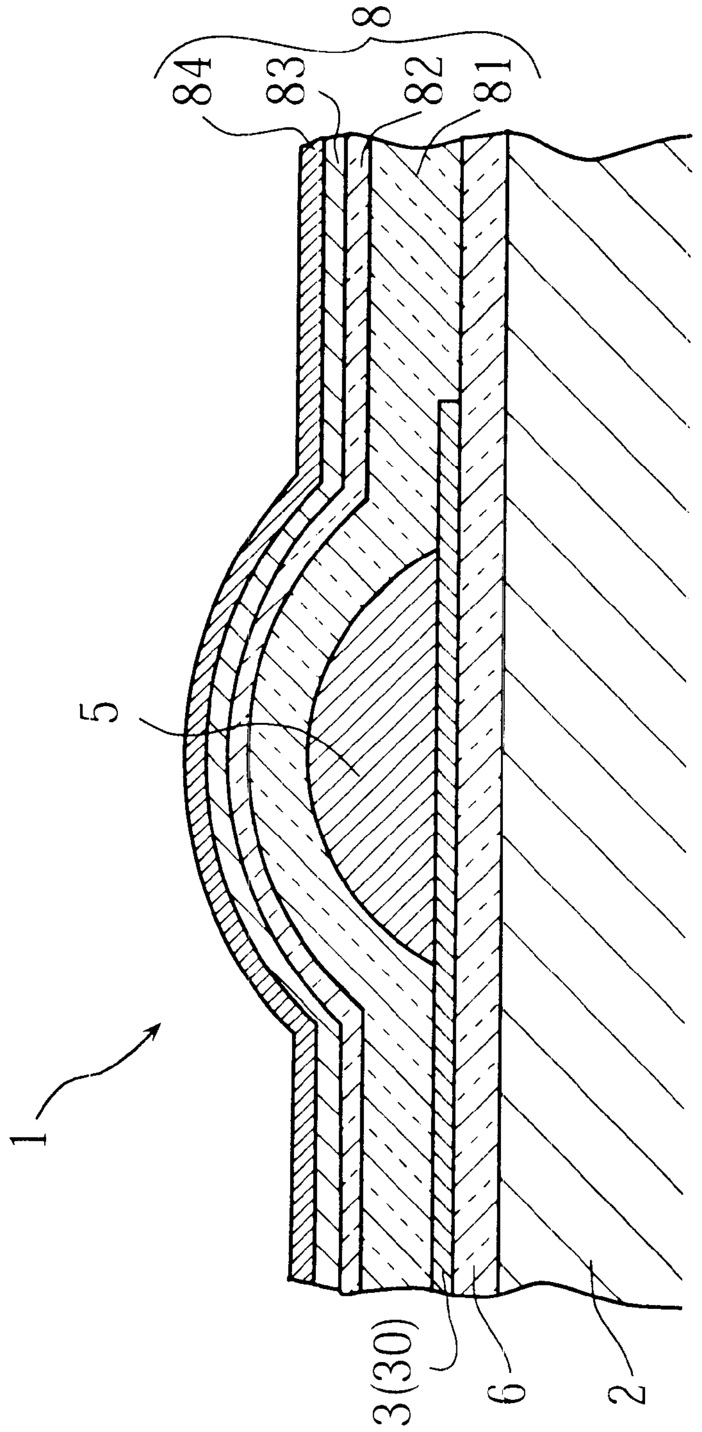
FIG. 2 is a sectional view taken in lines II—II in FIG. 1.

FIG. 1 and FIG. 2 show a thick-film thermal printhead 1 according to a preferred embodiment of the present invention. The thermal printhead 1 comprises a ceramic substrate 2 having an upper surface formed with a heat accumulating glaze layer 6, and an electrode pattern 3 formed on an upper surface of the glaze layer 6. The electrode pattern 3 includes a common electrode 30 and a plurality of individual electrodes 31. The common electrode 30 includes a plurality of comb-teeth like extensions 30*a*, and each of the extensions 30*a* is formed between two mutually adjacent individual electrodes 31. Likewise, each of the individual electrodes 31 has an end 31*a* formed between two mutually adjacent extensions 30*a* of the common electrode 30. Each individual electrode 31 has another end 31*b*, which serves as a connecting pad. The connecting pad 31*b* is connected via a wire to a corresponding but unillustrated drive IC. The electrode pattern 3 is formed by first printing and baking a pattern of resinated gold, and then etching the pattern by means of photolithography.

The extensions 30*a* of the common electrode 30, and the individual electrodes 31 are crossed by a thick-film heating resister 5 that extends straightly. In this heating resister 5, a portion sandwiched by mutually adjacent two extensions 30*a* (a cross-hatched portion in FIG. 1) serves as a unit of heating dot 50. The heating dot 50 is heated by a current from a corresponding but unillustrated drive IC. The heating resister 5 is formed, for example, by printing and baking a resister paste including ruthenium oxide.

Further, the thermal printhead 1 is provided, as shown in FIG. 2, with a protective coating 8 that covers the electrode pattern 3 and the heating resister 5. The protective coating 8 has a multi-layer structure including four layers, namely a thick glass layer 81, a thin glass layer 82, a primer layer 83 serving as an adhesive layer, and an outermost layer 84 which makes contact directly with the printing paper.

The thick glass layer 81 is formed by printing and baking a glass paste, as an amorphous-glass thick film having e.g. a thickness of about 10 $\mu$m and a Vickers hardness of 500–600 kg/$M^2$. The glass paste used for the formation of this thick film glass layer 81 contains for example about 26.5 weight percent of a resin component and about 73.5 weight percent of glass component.

The thin glass layer 82 is formed by a suitable method such as spattering, CVD method and vapor deposition, as a thin film of silicon dioxide ($SiO_2$) having a thickness of about 0.6 $\mu$m and a Vickers hardness of 500–700 kg/$m^2$.

The primer layer 83 is formed by a suitable method such as spattering, CVD method and vapor deposition, as a thin film of silicon carbide (SiC) having a thickness of about 2.0 $\mu$m and a Vickers hardness of 1600–1800 kg/$m^2$. Alternatively, the primer layer 83 may be formed of a metal such as titanium and tungsten, or titanium carbide.

The outermost layer 84 is formed by e.g. spattering to a thickness of about 4 $\mu$m and a Vickers hardness of about 1200 kg/$m^2$, from a film formation material. Specifically, the film formation material is a ceramic material containing silicon carbide (SiC) as a main component, and carbon (C) as an admixture element (hereinafter will simply be written as “C-SiC”.) More specifically, C-SiC that provides the outer most layer 84 has its carbon (C) content adjusted to 60–80 mol percent. C-SiC, containing carbon (C) as an additional element, has an advantageously denser structure, which offers superior function as compared to the structure made of pure silicon carbide (SiC), improving various film characteristics (especially in anti-wear and slidability characteristics) over the layer made of other materials. The improved film characteristics will be detailed later.

The outermost layer 84 formed of the C-SiC having the composition described above is formed by means of a reactive spattering, using a C-SiC target having the same composition. A desired film characteristic can be obtained by varying spattering conditions such as using a target of a different composition, and varying a concentration of active gases such as hydrogen and methane in an atmosphere.

Next, the characteristics of the C-SiC film (the outermost layer 84) will be described.

Figure 3:
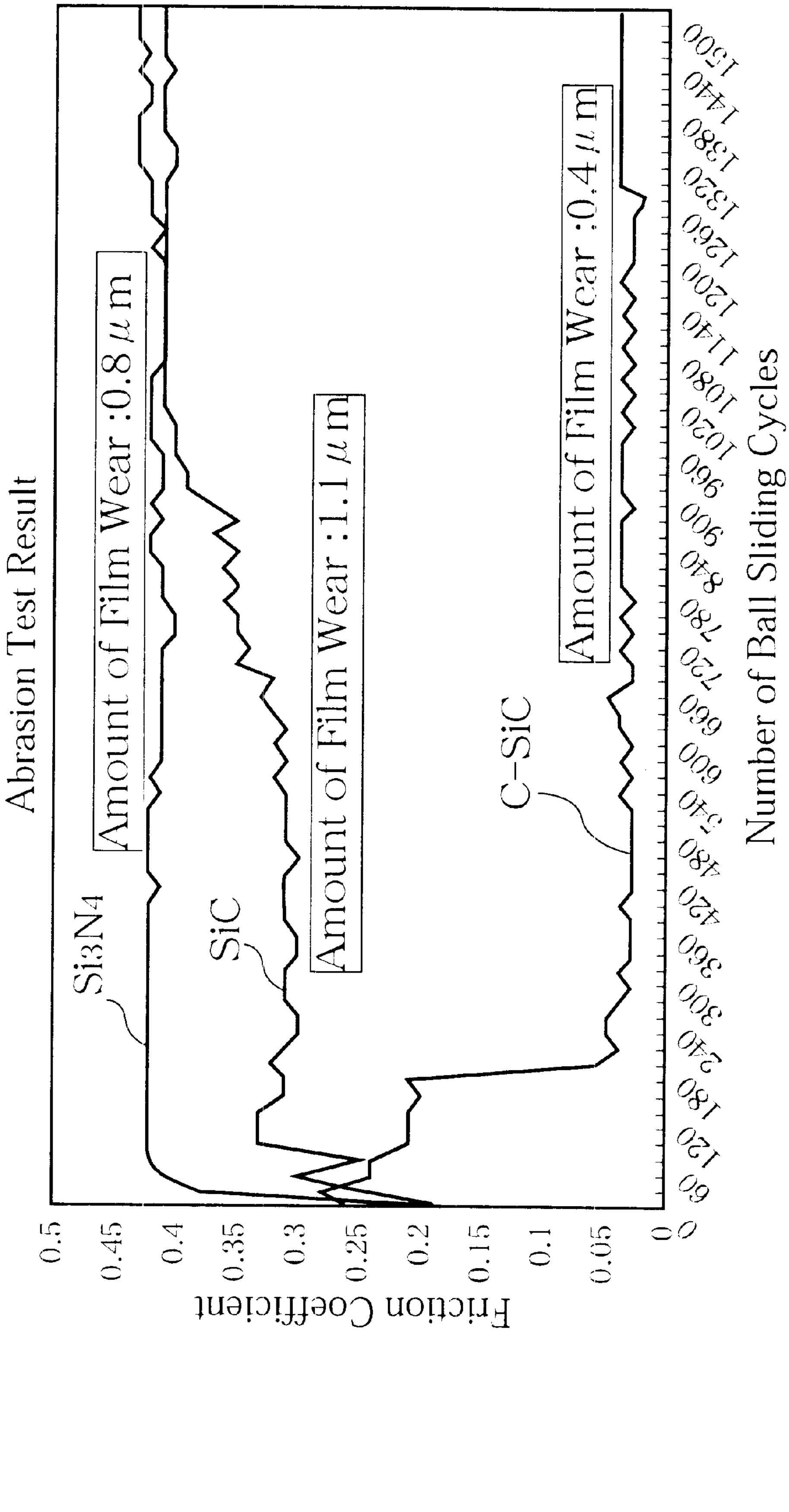
FIG. 3 is a graph showing a friction coefficient measured in a wearing test conducted to a C-SiC film, as a comparison with that of a conventional film.

FIG. 3 is a graph showing how a friction coefficient measurement changed in a wearing test conducted to a C-SiC film (the outermost layer 84), as a comparison with a conventional film. The wearing test was made on a commercially available friction wear tester (manufactured by Shinko Engineering Co., Ltd.) under the following test conditions.

| | |
|---|---|
| Temperature: | 24° C. |
| Ball: | Carbon Steel Ball |
| Load: | 500 g |
| Stroke: | 6 mm |
| Frequency: | 2 Hz |

Number of Sliding cycles: 1500 (12 mm/cycle)

The test conditions will be described briefly. Under a temperature condition of 24° C., the ball was pressed by a force of 500 g to a specimen (film) and moved to wear out the specimen. In the test, the stroke of the ball (a one-way distance covered in a forward and a rearward movement) was 6 mm (that is, a total ball travel per reciprocation cycle was 12 mm). Frequency (the number of cycles per second) was 2 Hz. The specimen was rubbed to be worn in a total of 1500 cycles.

As shown in the graph, the C-SiC film used as the outermost layer 84 according to the present embodiment showed a sharp decrease in its friction coefficient at about 200 rubbing cycles, and then kept an extremely low value, i.e. 0.05, permanently. Further, eventually, an amount of wear in the C-Sic film was less than half (or 0.4 μm) as in the conventional SiC film and $Si_3N_4$ film. This is probably because the addition of carbon (C) to silicon carbide has made the film surface that serves as the sliding surface into a dense structure which is extremely resistant to oxidization into silicon oxide ($SiO_2$).

In short, the C-Sic film according to the present embodiment has a friction coefficient that is extremely lower than the conventional films of different composition, and therefore the amount of wear is reduced. As a result, sufficient improvement is achieved in the slidability and anti-wear characteristic according to the C-Sic film.

Further, the C-SiC film has a tensile strength which is greater than twice the strength of e.g. the conventional $Si_3N_4$ film. Therefore, use of the C-SiC film as the outermost layer 84 enables to improve adhesion with the primer layer 83, and to improve protection against external force in that the layer becomes less prone to damages such as a scratch as well as less prone to the problem of coming off the under layer.

Further, according to the C-SiC film, by adjusting the carbon (C) mol percentage to a value not greater than 80 (and on the other hand, by adjusting the silicon (Si) mol percentage to a value not smaller than 20), it becomes possible to increase the film's specific resistance to not smaller than about $10^6$ ohm/cm. With this condition, since the film itself has an extremely low conductivity, it becomes possible to prevent the problem of electric corrosion such as that water on the film surface causes ionizing and elusion. On the other hand, since the C-SiC film has a slight conductivity, the outermost layer 84 provided by this film, being in contact with e.g. the common electrode 30, can discharge static electricity generated by the friction with the paper, making possible to prevent the problem of electrostatic puncture.

Further, if the outermost layer provided by the C-SiC film is made as a thin film having a thickness of about 4 μm, the protective coating 3 as a whole can be made thin, which enables to continue with a high thermal response from the heating resister 5 to the paper, and therefore to maintain a high printing quality. Further, since the C-SiC film is ceramic, it has no problem in terms of heat resistance.

Figure 4:
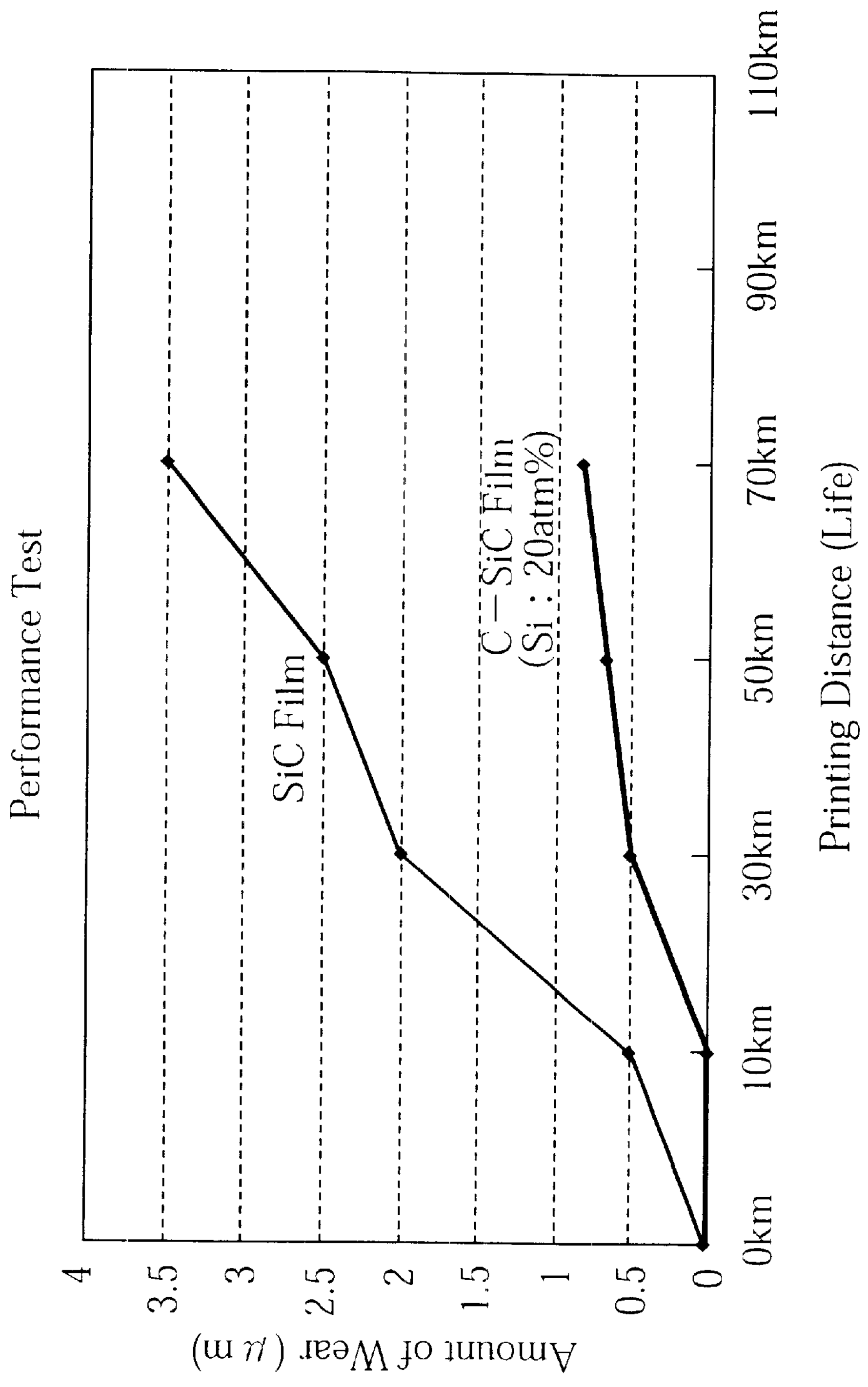
FIG. 4 is a graph showing a result of an operation test conducted to the thermal printhead according to the present invention, as a comparison with a conventional thermal printhead.

FIG. 4 is a graph showing a result of a performance test of the thermal printhead according to the present embodiment which has the outermost layer formed of the C-SiC film (containing 80 mol percent of carbon component and 20 mol percent of Silicon component). The result is compared with a conventional head having the outermost layer formed of the SiC film. The performance test was performed at 100 percent duty (i.e. all of the heating dots were driven to make continuous solid black printing), with the paper slid on the outermost layer. Evaluation of the test was made by an amount of wear of the outermost layer at predetermined points of printing distance.

As understood from the graph in FIG. 4, according to the conventional thermal printhead (sic film), the outermost layer originally had a thickness of about 4 μm. After printing 70 for kilometers, however, the amount of wear was as much as 3.5 m. On the contrary, according to the thermal printhead offered by the present invention (C-SiC film), the amount of wear at the 70 kilometer printing distance did not reach even a quarter of the original thickness (about 4 μm). This indicates that the thermal printhead according to the present embodiment has a service life more than three times longer than the conventional one. Therefore, the thermal printhead according to the present embodiment is suitable for a printing apparatus which requires a significantly high durability (for example, a barcode printer).

Although the above embodiment is a thick-film thermal printhead, the present invention is also applicable to a thin-film thermal printhead.

What is claimed is:

1. A thermal printhead comprising:

a substrate;

an electrode pattern formed on the substrate, including a common electrode and a plurality of individual electrodes;

a plurality of heating dots connected to the electrode pattern; and a protective coating including a plurality of layers covering the electrode pattern and the heating dots;

wherein the protective coating includes an outermost layer composed mainly of SiC and an admixture of carbon.

2. The thermal printhead according to claim 1, wherein the carbon content in the outermost layer is not lower than 60 mol percent.

3. The thermal printhead according to claim 2, wherein the carbon content in the outermost layer is 60–80 mol percent.

4. The thermal printhead according to claim 1, wherein the protective coating includes, in addition to the outermost layer, a thick glass layer covering the heating dots and the electrode pattern, a thin glass layer formed on the thick glass layer, and an adhesion layer formed between the thin glass layer and the outermost layer.

5. The thermal printhead according to claim 1, wherein the heating dots are provided by a straight thick-film resister.

6. A method of manufacturing a thermal printhead comprising: a substrate; an electrode pattern formed on the substrate, including a common electrode and a plurality of individual electrodes; a plurality of heating dots connected to the electrode pattern; and a protective coating including a plurality of layers covering the electrode pattern and the heating dots;

wherein the outermost layer of the protective coating is formed by spattering with a use of a target composed mainly of SiC and an admixture of carbon.

7. The method according to claim 6, wherein the carbon content in the target is not lower than 60 mol percent.

8. The thermal printhead according to claim 7, wherein the carbon content in the target is 60–80 mol percent.

9. The method according to claim 6, wherein the carbon content in the target is varied for controlling a film characteristic of the resulting outermost layer.

10. The method according to claim 6, wherein the spattering is provided by a reactive spattering.

* * * * *